(12) United States Patent
Rabjohn et al.

(10) Patent No.: US 7,728,663 B2
(45) Date of Patent: Jun. 1, 2010

(54) INTEGRATED IMPLEMENTATION OF A VOLTAGE BOOST FOLLOWER AND METHOD THEREFOR

(75) Inventors: Gordon G. Rabjohn, Ottawa (CA); Johan Grundlingh, Kinburn (CA); Edward J. Whittaker, Bishop's Stortford (GB)

(73) Assignee: SiGe Semiconductor Inc., Ottawa, Ontario (CA)

( * ) Notice: Subject to any disclaimer, the term of this patent is extended or adjusted under 35 U.S.C. 154(b) by 652 days.

(21) Appl. No.: 11/472,473

(22) Filed: Jun. 22, 2006

(65) Prior Publication Data

US 2007/0296504 A1    Dec. 27, 2007

(51) Int. Cl.
*H03F 3/68* (2006.01)
(52) U.S. Cl. .................. 330/124 R; 330/295; 330/297
(58) Field of Classification Search ............. 330/124 R, 330/295, 297
See application file for complete search history.

(56) References Cited

U.S. PATENT DOCUMENTS

| | | | |
|---|---|---|---|
| 5,450,036 A * | 9/1995 | Nishioka et al. ............ 330/273 |
| 6,198,347 B1 | 3/2001 | Sander et al. | |
| 6,437,641 B1 | 8/2002 | Bar-David | |
| 6,831,519 B2 | 12/2004 | Bar-David et al. | |
| 6,937,094 B2 | 8/2005 | Khanifar et al. | |
| 7,348,847 B2 * | 3/2008 | Whittaker ................. 330/250 |
| 2002/0030543 A1 * | 3/2002 | French et al. ............. 330/297 |
| 2002/0153940 A1 | 10/2002 | Wurcer et al. | |
| 2005/0285682 A1 | 12/2005 | Lee et al. | |
| 2006/0147062 A1 * | 7/2006 | Niwa et al. ............... 381/113 |

FOREIGN PATENT DOCUMENTS

WO    WO 01/67598 A1    9/2001
WO    WO 2004/086321 A2    10/2004

OTHER PUBLICATIONS

European Search Report for EP 07 72 0007 mailed Jul. 24, 2009.

* cited by examiner

*Primary Examiner*—Michael B Shingleton
(74) *Attorney, Agent, or Firm*—Townsend and Townsend and Crew LLP

(57) ABSTRACT

A collector boost circuit is disclosed for providing a first voltage in a first mode of operation to a power amplifier, and another voltage in a second mode of operation to the power amplifier. The collector boost circuit uses an indicator signal derived by an RF detector to switch between the first and the second mode of operation. The another voltage is a boosted voltage greater than the first voltage and is provided when required during peak excursions to prevent amplifier clipping through a boost capacitor. The another voltage is continuous and varies in accordance with the detected peak signal amplitude.

21 Claims, 8 Drawing Sheets

INTEGRATED IMPLEMENTATION OF A VOLTAGE BOOST FOLLOWER AND METHOD THEREFOR

FIELD OF THE INVENTION

The invention relates to amplifiers and more particularly to integrated power amplifiers.

BACKGROUND OF THE INVENTION

Frequency division multiplexing (FDM) is a technology for transmitting different data sets within each of multiple signals simultaneously over a single transmission path, such as a cable or wireless system. Each signal travels within a carrier—a unique frequency range that is modulated by data being transmitted.

Orthogonal frequency division multiplexing (OFDM) is a spread spectrum technique that distributes each data set of the different data sets over a large number of carriers that are spaced apart at predetermined frequencies. This spacing provides the "orthogonality" in this technique, which allows for demodulators that are responsive only to frequencies relating to a signal data set. The benefits of OFDM are high spectral efficiency, resiliency to RF interference, and immunity to multi-path distortion. OFDM is advantageous because in a typical terrestrial broadcasting scenario there are multi-path channels—transmitted signals arrive at a receiver using various paths of different length. Since multiple versions of a signal interfere one with another it becomes difficult to extract data being transmitted.

High bandwidth-efficiency modulation schemes (such as, but not restricted to FDM, OFDM, and CDMA) usually result in signals that exhibit a large dynamic range, or peak to average power ratio (PAPR). For amplifying such a signal, an amplifier must support a range of pulse amplitudes from a first level of low amplitude through to a second level of high amplitude, and accommodate as such this peak amplitude. Though support for peak amplitude is a requirement in high bandwidth efficiency modulation standards, peak pulses come with such infrequency that designing a power amplifier (PA) to support them, though required, increases the power consumption of the PA and adds a level of complexity and cost that is undesirable.

For example, it is known to improve power consumption of PAs by varying supply voltage with a DC-to-DC converter to be proportional to the amplitude of the transmitted signal as depicted in U.S. Pat. No. 6,081,161 (Dacus et al, "Amplifier with Dynamically Adaptable Supply Voltage). Lower collector voltages are used to achieve lower output powers and higher collector voltages are used to deal with higher amplitude portions of the signal to be transmitted. Assuming high efficiencies in the regulator, very low power consumption is realized at low modulation frequencies by switch-mode techniques. As the frequency of the modulation is increased the difficulty of designing ever-faster switch-mode regulators becomes too great and linear power handling stages are needed and no efficiency gain results.

The regulator approach is Prior Art and, is an effective way of increasing the PA efficiency, by varying the collector or drain voltage on the amplifying transistor and changing the load line of the PA. Linearity requirements, however, force the gain/phase response to be linear with voltage change, or that pre-distortion is applied.

Other variants on this theme attempt to use a very fast, envelope tracking power supply on the collector in combination with a variable base supply. The modulation amplitude is realized by varying the power supply voltage while the phase information is injected onto the RF signal. Envelope tracking requires an even more complex power supply than the DC-to-DC converter approach and has yet to be demonstrated in a practical fashion. Such a circuit is disclosed in U.S. Pat. No. 6,437,641 where an excess envelope sensor is used to detect peak voltages and in turn enhance the output voltage fed to the power amplifier.

Several RF systems containing power amplifiers have recurrent periods with large peak excursions and these peak excursions need to be handled, in order to improve the efficiency of these systems by ensuring linearity of the power amplifier. As discussed in WO 01/67598, in prior art applications, one method to handle signals with large peak-to-average ratios is to control the DC power supply to a power amplifier. For example, in this case, one set of voltage levels are supplied to the power amplifier when the instantaneous amplitude is below a desired level and another set of voltage levels is supplied when the instantaneous amplitude is above a desired level.

In prior art, U.S. Pat. No. 6,831,519 a circuit is disclosed for allowing a power amplifier to work under different operating power supply voltages, in response to different input signals. Specifically, circuitry is provided for controlling the level of the voltage supplied to a power amplifier, via supplementary supply path. In this circuit, two controllable impedances in the form of field-effect transistors as well as an inductor are provided, for when in operation with control pulses, directing the flow of current and providing enhancement voltage to the amplifier when necessary. However, the disadvantage of such a circuit is that it is not realizable within a low cost integrated power amplifier due to the difficulty in integrating the inductor and the PA on the same substrate.

It would be advantageous to provide a method and apparatus to improve the power output, efficiency, and distortion of an OFDM power amplifier without significantly increasing the power supply complexity, or needing a second voltage supply. Advantageously, improving these attributes is beneficial in WLAN systems in order to provide users with better data transmission range, longer intervals between battery charging, and more generally lower power consumption.

It would be further advantageous to provide a method that is suited to integration within a single integrated circuit.

SUMMARY OF THE INVENTION

In accordance with the invention there is provided a circuit comprising: a charge storage component; an amplifier voltage supply port; a voltage supply input port for receiving a first voltage; a detector for being electrically coupled to an output port of an RF amplifier, the detector for detecting an amplitude of an RF output signal provided from the RF amplifier; and, at least a switch responsive to an indicator signal for switching between a first mode of operation and a second other mode of operation, in the first mode of operation, the at least a switch for charging of the charge storage component and for providing the first voltage to the amplifier voltage supply port and in the second mode of operation the at least a switch for providing a boost voltage at the amplifier voltage supply port in excess of the first voltage, the boost voltage resulting from a cooperation of the charge storage component and the first voltage and following the detected amplitude.

In accordance with an embodiment of the invention there is provided a circuit comprising: an amplifier voltage supply port; a first voltage supply input port for receiving a first voltage; a second voltage supply input port for receiving a second other voltage; detector for being electrically coupled to an output port of an RF amplifier, the detector for detecting an amplitude of an RF output signal provided from the RF amplifier; and, at least a switch responsive to the indicator signal for switching between a first mode of operation and a second other mode of operation, in the first mode of operation, the at least a switch for providing a voltage based on the first voltage at the amplifier voltage supply port and in the second mode of operation the at least a switch for providing another voltage at the amplifier voltage supply port in excess of the first voltage and based on the second voltage, the another voltage following the detected amplitude.

In accordance with another aspect of the invention there is provided a method of improving linearity of a power amplifier comprising: a circuit that controls the voltage supply to a power amplifier in accordance to the voltage generated by a detector at the output of the power amplifier such that in a first mode of operation, providing a first voltage potential to the amplifier voltage input port; in a second other mode of operation, providing a boosted voltage potential to the amplifier voltage input port, the boosted voltage potential formed by summing a first voltage potential from a voltage supply and at least a portion of another voltage potential, the boosted voltage following the detected amplitude in a continuous fashion; and, switching from the first mode to the second mode in dependence upon a detected a presence of a peak pulse within the RF signal.

In accordance with yet another aspect of the invention there is provided a storage medium having stored therein data, the data for when executed resulting in an amplifier design comprising: a charge storage component; an amplifier voltage supply port; a voltage supply input port for receiving a first voltage; a detector coupled to an output port of an RF amplifier, the detector for detecting an amplitude of an RF output signal provided from the RF amplifier; and, at least a switch responsive to the indicator signal for switching between a first mode of operation and a second other mode of operation, in the first mode of operation, the at least a switch for charging of the charge storage capacitor and for providing the first voltage to the amplifier voltage supply port and in the second mode of operation the at least a switch for providing a boost voltage at the amplifier voltage supply port in excess of the first voltage, the boost voltage resulting from a cooperation of the charge storage capacitor and the first voltage and following the detected amplitude.

In accordance with an embodiment of the invention there is provided a storage medium having stored therein data, the data for when executed resulting in an amplifier design comprising: an amplifier voltage supply port; a first voltage supply input port for receiving a first voltage; a second voltage supply input port for receiving a second other voltage; detector for being electrically coupled to an output port of an RF amplifier, the detector for detecting an amplitude of an RF output signal provided from the RF amplifier; and, at least a switch responsive to the indicator signal for switching between a first mode of operation and a second other mode of operation, in the first mode of operation, the at least a switch for providing a voltage based on the first voltage at the amplifier voltage supply port and in the second mode of operation the at least a switch for providing another voltage at the amplifier voltage supply port in excess of the first voltage and based on the second voltage, the another voltage following the detected amplitude.

BRIEF DESCRIPTION OF THE DRAWINGS

Exemplary embodiments of the invention will now be described in conjunction with the following drawings, in which:

FIG. 2b illustrates a simplified block diagram of the Voltage Booster (220) in FIG. 2a;

DETAILED DESCRIPTION OF AN EMBODIMENT OF THE INVENTION

Figure 1A:
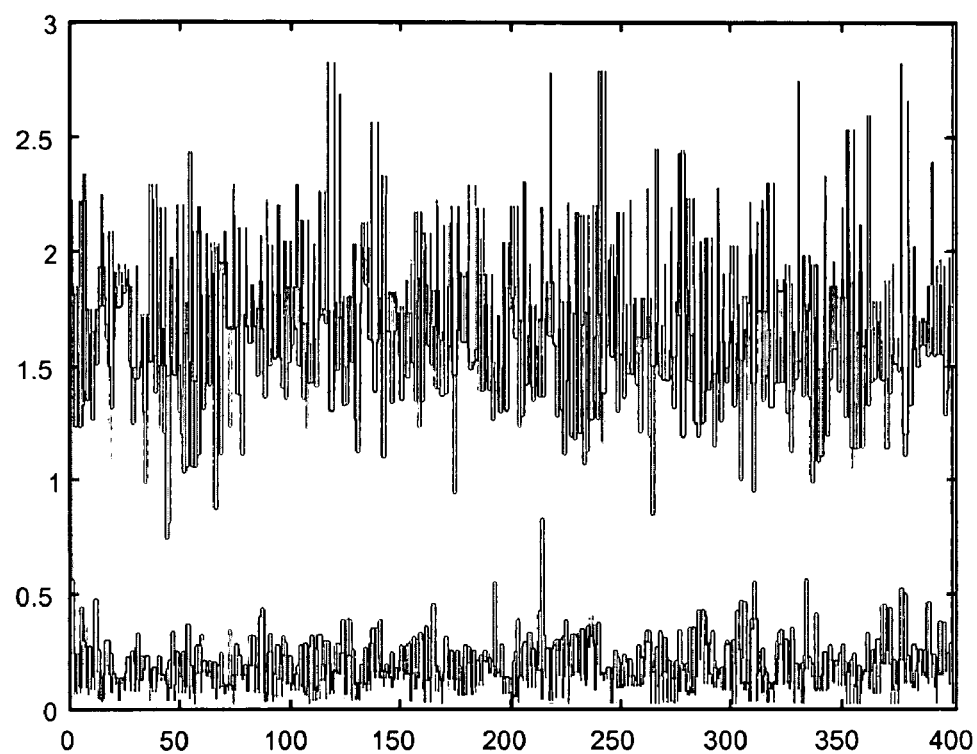
FIG. 1a illustrates a graph of linear RF output envelope voltage versus time for 100 OFDM symbols.

Referring to FIG. 1a, shown is a graph of linear RF output voltage versus time for a sequence of 100 OFDM symbols. The graph represents the magnitude of the RF envelope. In an ideal system, power used in the power amplifier (PA) would be at any instant proportional to the square of the RF voltage required. The peaks of the signal occur infrequently thus the mean output power of the PA is significantly below its peak output. So even in a class B amplifying stage where the current used is proportional to RF signal amplitude voltage, the efficiency is proportional to RF signal amplitude voltage, the constant dc collector supply voltage has to be sufficiently large to handle the peaks of the signal without amplifier clipping. This results in inefficiency when the amplifier is operating at lower power levels since there is unused voltage headroom available to the amplifier. If a lower supply voltage is used the amplifier distorts on the peaks and the information content of the OFDM signal may be corrupted.

Current generation portable battery operated devices rely on advances in battery technology and on advances in low power circuit operation in order to enhance battery life, reduce circuit costs, and improve reliability. Unfortunately, even using class B operation results in inefficiency as noted above. To date many integrated solutions for OFDM PAs have relied on class B operation and as a result the efficiency of the PA under OFDM modulation has been constrained. Therefore either battery life, battery size or PA output power has suffered. The current invention demonstrates a method to improve the efficiency of an integrated PA with signals of large dynamic range, thereby improving battery utilisation and reducing the heat dissipated in the PA.

Since peak pulses are statistically infrequent, operation of a PA in an inefficient mode for the sole purpose of supporting peak pulses is not ideal. Furthermore, failing to support peak pulses, and therefore introducing distortion, and therefore degrading out-of-band emissions and Error Vector Magnitude, is also not ideal.

Figure 1B:
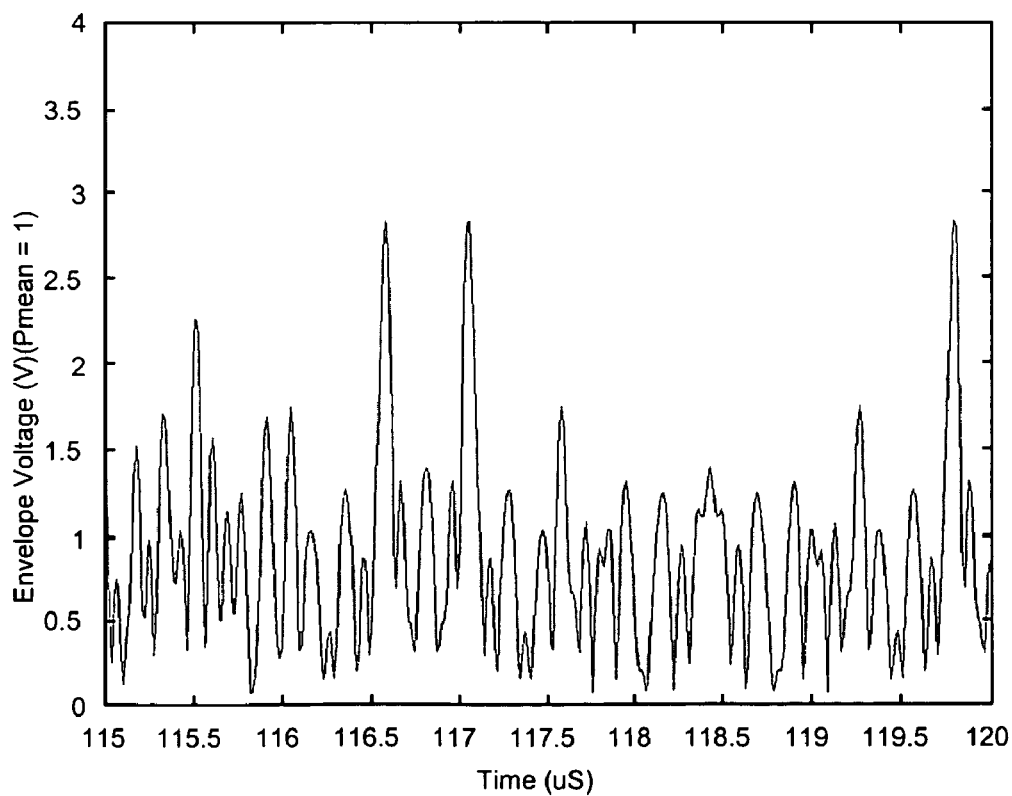
FIG. 1b illustrates a graphical representation depicting RF output envelope voltage versus time of a peak pulse.

Referring to FIG. 1b, an expansion of part of the 100 OFDM symbol sequence is shown, here it can be clearly seen that high power pulses are not only infrequent but of very short duration.

Figure 2A:
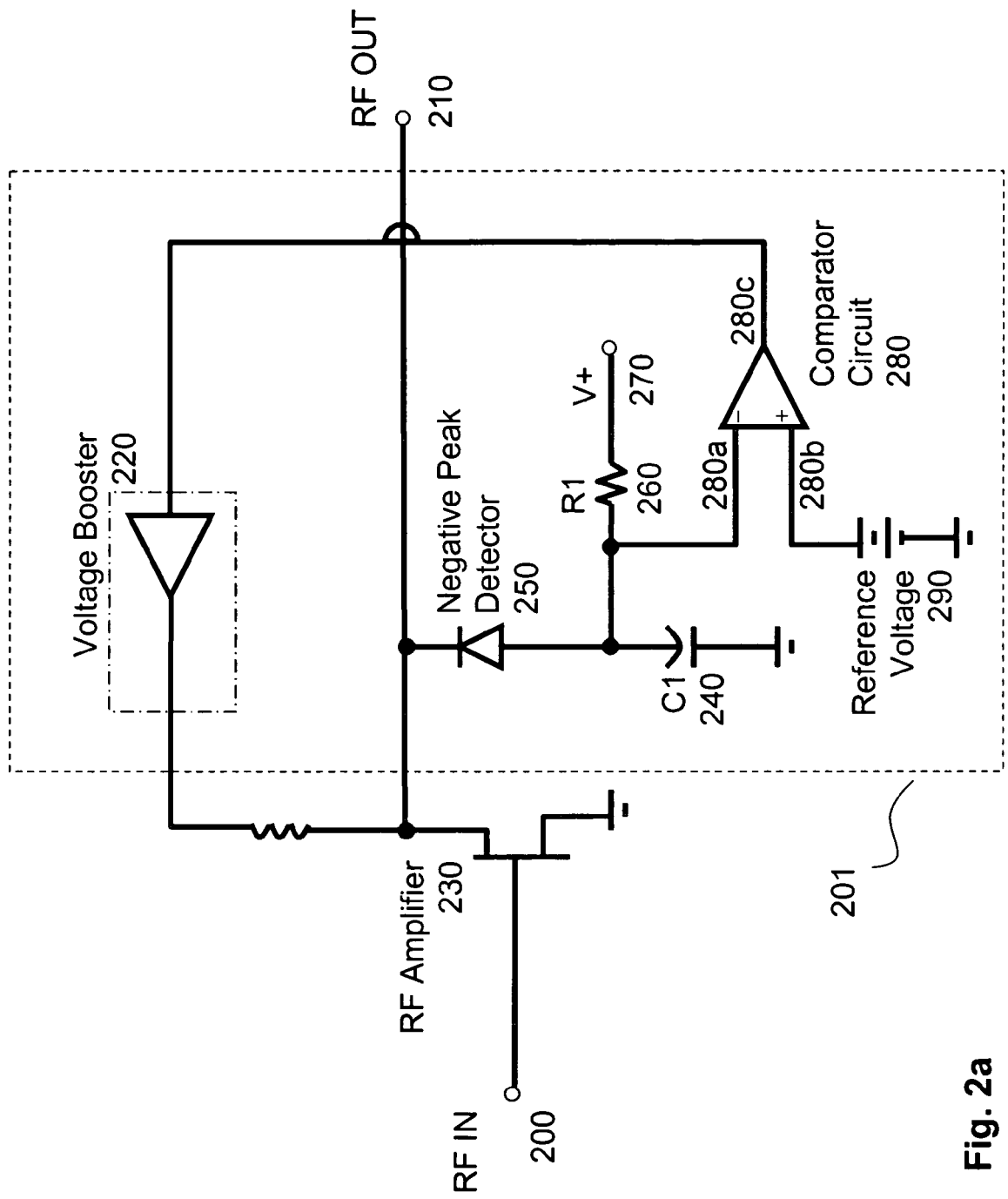
FIG. 2a illustrates a simplified block diagram of a circuit according to a first embodiment of the invention.

Referring to FIG. 2a, a simplified circuit diagram of a first embodiment of the invention is shown. To extend a prior art class B amplifier operation according to the invention, the collector voltage of an RF amplifier 230 is boosted only for peak pulses above a specified threshold as determined by comparator circuit 280.

An RF input signal is applied to the RF input port 200, which is electrically coupled to the RF amplifier 230. The output of the RF amplifier 230 being electrically coupled to the RF output port 210. Also electrically connected to the RF output of the RF amplifier 230 is a negative peak detector 250, in this embodiment, which provides a voltage in inverse proportion to the RF signal power. The negative peak detector 250 is resistively coupled to a power supply V+ at port 270 via resistor 260, and capacitively coupled to ground via capacitor C1 240. The resistor 260 and capacitor 240 remove the RF content from the detected signal without filtering the envelope content.

The filtered voltage envelope from the negative peak detector 250 is coupled to the upper input port 280a of a comparator circuit 280. The lower input port 280b of the comparator circuit 280 being coupled to a voltage reference 290.

In this embodiment the negative peak detector 250 senses when the voltage at the collector/drain of the RF amplifier 230 drops below a threshold (indicating the onset of saturation). The output of this negative peak detector 250 is used in the feedback loop to control the voltage boosting circuit 220. In this manner, as the overall circuit control 201 senses that the output stage RF amplifier 230 is starting to saturate, it forces the voltage booster 220 to increase the supply voltage just enough to pull/keep the RF amplifier 230 out of saturation.

The duration of the boost applied by the voltage booster 220 is determined by the duration of the peak. In this manner the boost is applied only as required by the RF amplifier 230 therein lowering the power consumption of the RF amplifier 230.

This first implementation has the advantages of the feedback tending to minimize the sensitivity of the circuit to absolute component values, and variations in component temperatures. Additionally the clipping threshold is independent of power supply, that is, the circuit can be configured so that, regardless of the power supply, the boosting starts when the RF amplifier 230 runs out of headroom. In the case of a bipolar transistor, this threshold would be set to approximately the saturation voltage Vcesat.

Finally, this implementation makes the circuit immune to any harmonic content in the amplified RF signal that will tend to square the RF waveform at the output of 230.

Figure 2B:
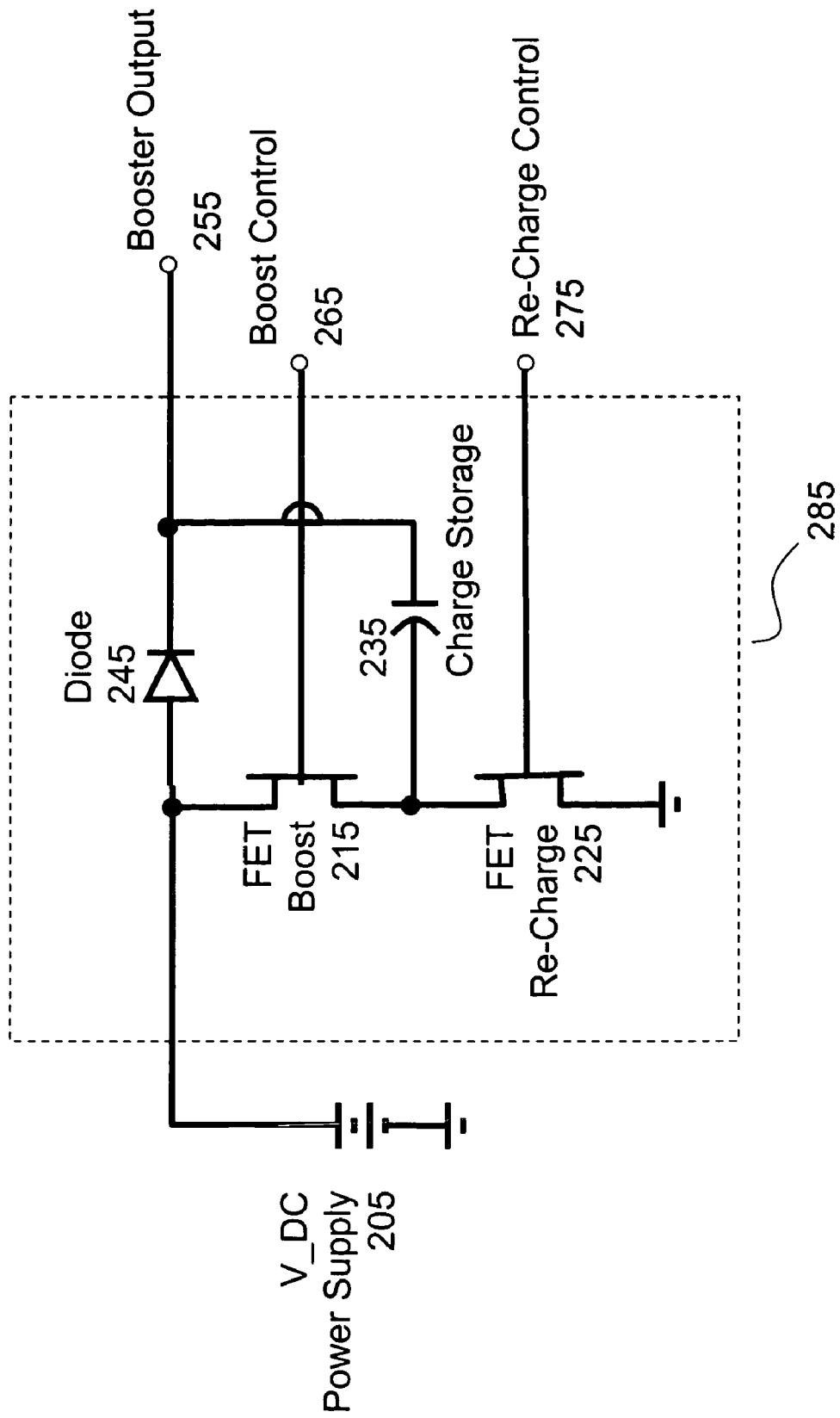

Referring to FIG. 2b, shown is the details of the voltage booster shown in box 220 in FIG. 2a.

The voltage booster circuit 285 comprising of a charge storage device 235 and switching devices 215, 225, 245. In the voltage booster circuit 285 as shown, when the upper booster FET 215 is turned-on by the boost control signal applied to the boost control port 265, the supply voltage applied to an RF amplifier (not shown) at the booster output port 255 is boosted because the voltage across the 235 is effectively added to a fraction of the DC power supply 205, where the fraction is determined by the voltage drop across FET 215. The boosted output voltage 255 can follow the boost control voltage 265 up to approximately double the DC supply 205.

When the voltage booster circuit 285 is not providing a voltage boost signal then the upper booster FET 215 is not turned on and a control signal is applied to the re-charge control port 275 so the re-charge FET 225 is active thereby re-charging the charge storage capacity 235. The voltage booster circuit 285 being connected to the power supply 205, and completed by the reverse current protection diode 245. The diode 245 allows the amplifier to be powered from 205 when low output signals are required, yet allows the voltage at 255 to rise above 205 when in boosted mode.

For example, assume the voltage source 205 is a 3.3V supply and compatible with standard 3.3V integrated circuit technology. In unboosted operation, the power amplifier is fed from the voltage source 205 via a reverse current protection diode 245. In boosted operation, when the peak detector (e.g. FIG. 2a negative peak detector 250) senses a signal at an RF output port (FIG. 2a 210) that is near an amplitude at which clipping occurs, the charge storage block 235 is engaged for providing a boosted voltage, for example using the off chip boost capacitor. In boosted operation, the voltage applied to the RF amplifier (FIG. 2a 230) is increased as necessary. Alternatively, the voltage applied to the RF amplifier (FIG. 2a 230) is boosted from 3.3 V to as much as 6.6 V whenever a boost in voltage is indicated. Once the boost operation is no longer indicated, power is again provided via the reverse current protection device 245.

The recharge signal, 275, is derived from the boost control, 265, in such a manner that both FET 215 and FET 225 are not on simultaneously. This may be accomplished entirely with N-channel FETs. Alternatively, if a negative supply is acceptable, then depletion mode FETs, or HEMTs may be deployed. If a negative supply is unavailable, then E− and D− mode FETs are one alternative solution. Additionally, other alternatives such as CMOS devices are deployable, alongside bipolar devices. Further, in other embodiments diode 306 may be implemented with bipolar transistors or FETs. For example, a PNP bipolar transistor may be used, and this could result in a lower forward voltage drop.

Figure 3:
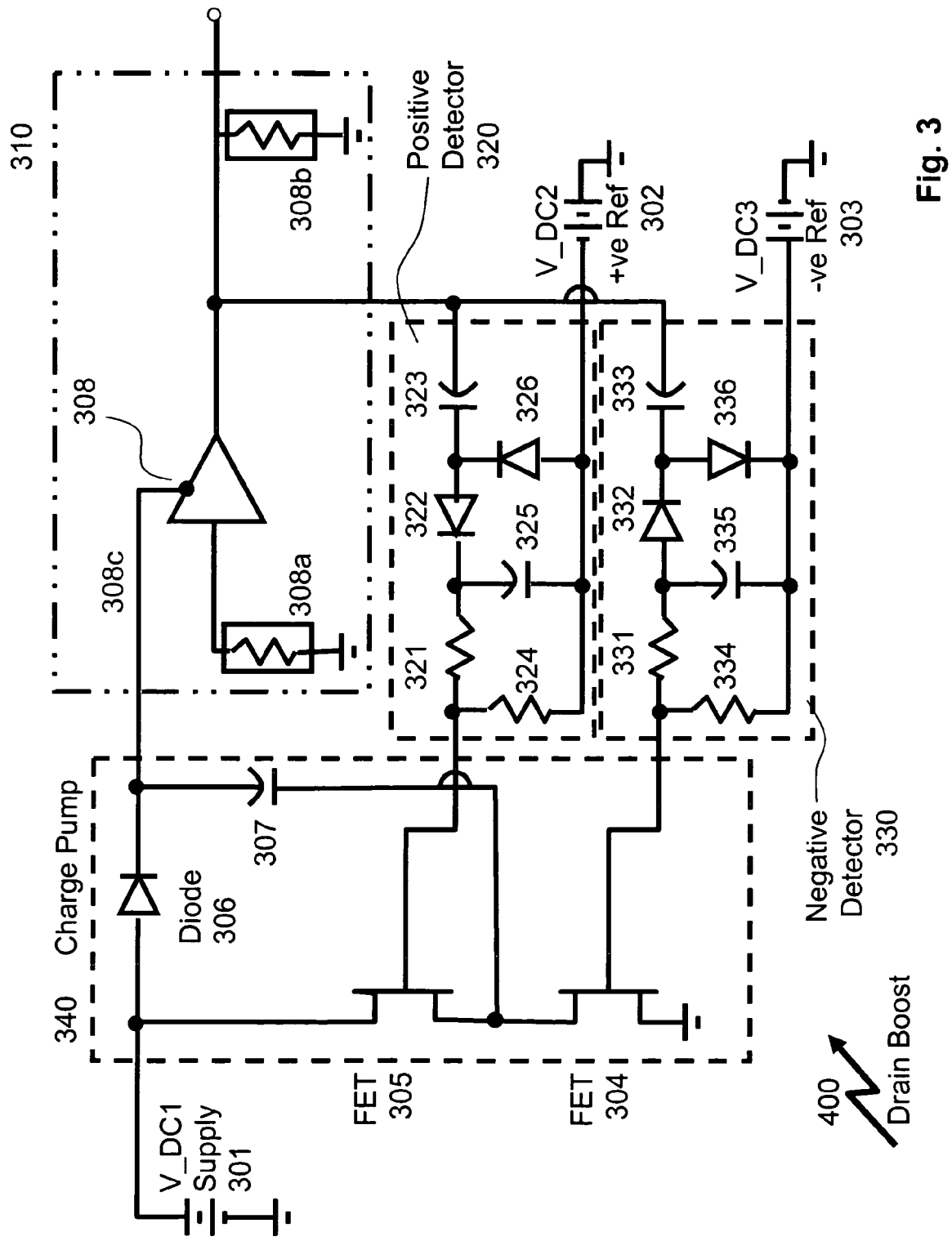
FIG. 3 shows a circuit diagram for implementing a second embodiment of the invention.

FIG. 3 shows a further simplified exemplary circuit diagram in accordance with an embodiment of the invention. The circuit relies on an off chip boost capacitor to increase effective drain voltage available to the RF amplifier transistor during amplitude peaks. Alternatively, the capacitor is other than off-chip. According to the embodiment, amplitude is sensed at the output port of the amplifier with a detector for detecting amplitudes above the threshold amplitude. An output signal from the detector is applied directly to a first FET. The first FET pushes the charge storage capacitor up, thereby raising the Vdd on the RF amplifier, in response to the signal received from the detector. The gain and offset of the path between the RF output port of the amplifier and the first FET is adjusted so that the amplifier supply voltage increases before the amplifier begins saturating. Thus, clipping of the amplified RF signal is avoided. As shown in FIG. 3, this is accomplished entirely with N-channel FETs. If a negative supply is acceptable, depletion mode FETs, or HEMTs are sufficient. If a negative supply is unavailable, then E− and D− mode FETs are used. Alternatively, CMOS devices are used. Further alternatively, bipolar devices are used. Further alternatively, the diode 306 may be implemented with bipolar transistors or FETs. For example, a PNP bipolar transistor may be used, and this could result in a lower forward voltage drop.

An amplifier block 310 includes an amplifier 308 with an RF input 308a, an RF output, 308b, and a voltage bias terminal 308c. A charge pump circuit 340 comprises a reverse current prevention circuit in the form of diode 306, a first FET 305, a second FET 304, and a charge storage device 307. The charge pump 340 is for charging the charge storage device in the form of capacitor 307 when stimulated by the negative detector 330, and for facilitating the connection of the capacitor in series with the DC supply 301 in boost mode when stimulated by the positive detector 320. The second FET 304 controls charging of the charge storage device 307. The first FET 305 facilitates the series connection of the charge storage capacitor 307 in series with the DC supply. The circuit also includes a positive detector 320 and a negative detector 330.

Charge storage capacitor 307 within the charge pump circuit 340 is normally charged to the supply voltage V_DC1 301, for example 3.3V, through the diode D1 306 and the FET 304. When a peak in the RF signal having amplitude above a predetermined threshold is detected, the supply voltage to the amplifier 308 is increased to prevent clipping of the output RF signal. As such, FET 304 is turned off under control of the negative detector 330, and FET 305 is turned on under control of the positive detector 320.

The FET 305 operates as a source follower, in principal, so the voltage at its source follows the voltage provided thereto by the positive detector 330. As the source voltage of FET 305 increases, the voltage at a port between the diode 306 and the charge storage capacitor 307 increases, turning off diode 306 and causing an increased voltage at a voltage supply port of the amplifier 308. It is noted that the transistor 305 operates within a linear range as opposed to swinging between two binary states—switching. The linear response of transistor 305 allows for discontinuity-free voltage swing on the voltage supply port of RF amplifier 308.

When the RF signal at an RF output port 308b is detected to be below the threshold level, voltage on the gate of transistor 305 causes it to stop following the signal. Current to the amplifier 308 is again supplied from a voltage source through diode 306. The charge storage capacitor 307 recharges through diode 306 when transistor 304 turns on. Transistor 304 is typically a normally on depletion mode device. Optionally, transistor 305 is a depletion mode transistor as well. Alternatively, transistor Q2 304 is an enhancement mode device. Typically diode 306 is one of a diode and a low barrier Schottky diode. Alternatively, reverse current protection is provided using one of a switched transistor, a driven transistor, and a source or collector follower. Alternatively, transistor 304 is a bipolar transistor. Alternatively, transistor 305 is a bipolar transistor.

In design, V_DC2 being the positive voltage reference 302, V_DC3 being the negative voltage reference 303, and values of resistors R1 321, R2 324, R3 331, R4 334 determine the threshold points where transistor Q1 305 turns off and where transistor Q2 304 starts to follow. Typically, the values of V_DC2 302, V_DC3 303, R1 321, R2 324, R3 331, and R4 334 are selected so that transistor Q1 305 and transistor Q2 304 are other than both on simultaneously; this ensures that resulting voltage at a voltage supply port of the amplifier 308 follows appropriately for avoiding clipping of the output RF signal.

Advantageously, the low loop gain in the above-described circuit makes the envelope follower easy to implement in a fashion that is insensitive to process and temperature variations. This is advantageous as the circuit is manufacturable without changes to manufacturing processes employed. Due to the peak-to-average power ratios (PAPR)—when peak-to-average power ratios (PAPR) that are too low are present, the charge storage capacitor 307 is unable to fully recharge between peak amplitude bursts resulting in degraded performance—the above described embodiment is advantageous for use in WiMAX and many WiFi applications. Further, with suitable modifications it is applicable to many other products wherein the PAPR is sufficiently high.

Figure 4A:
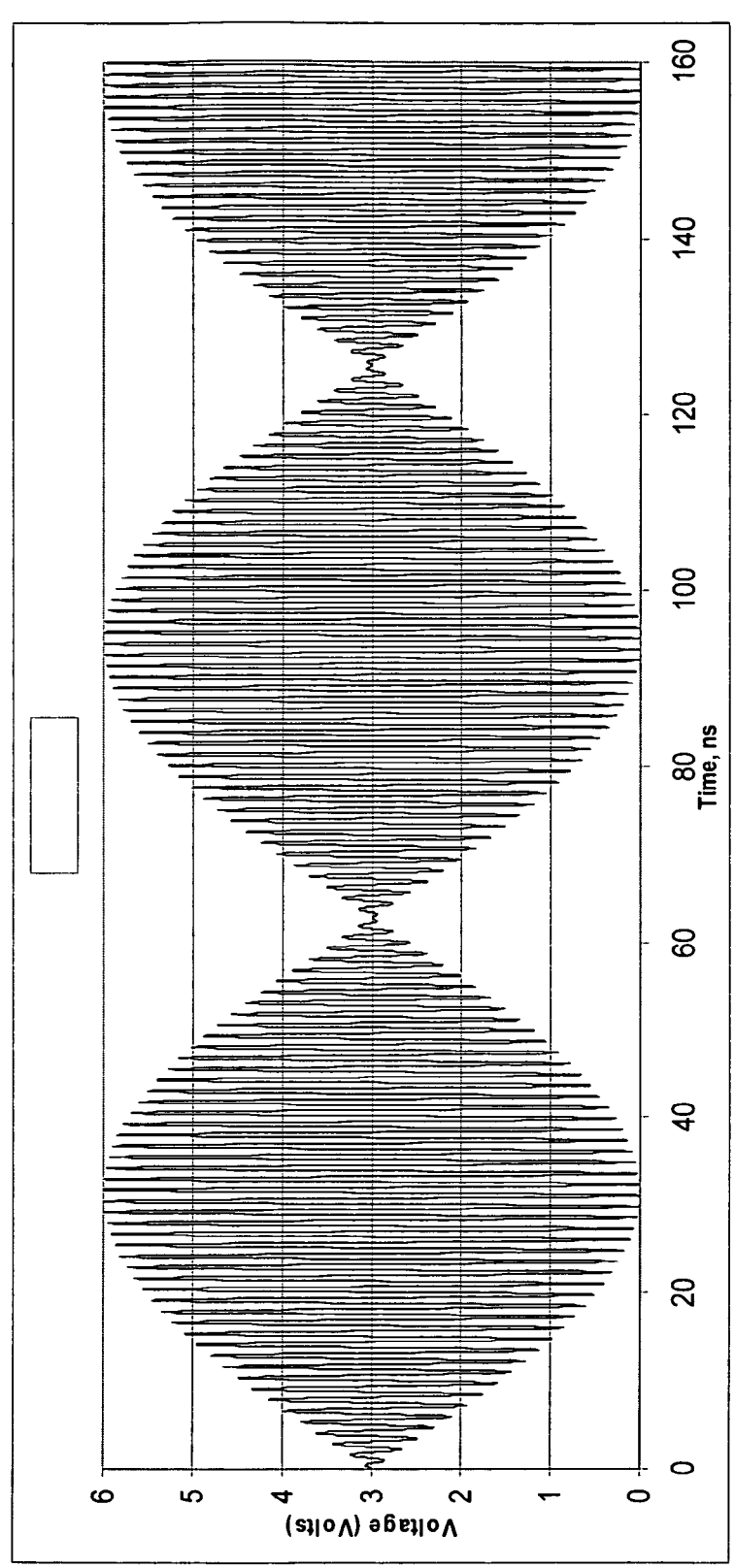
FIG. 4a shows an ideal peaky two-tone waveform as would occur in a perfect amplifier.
Figure 4B:
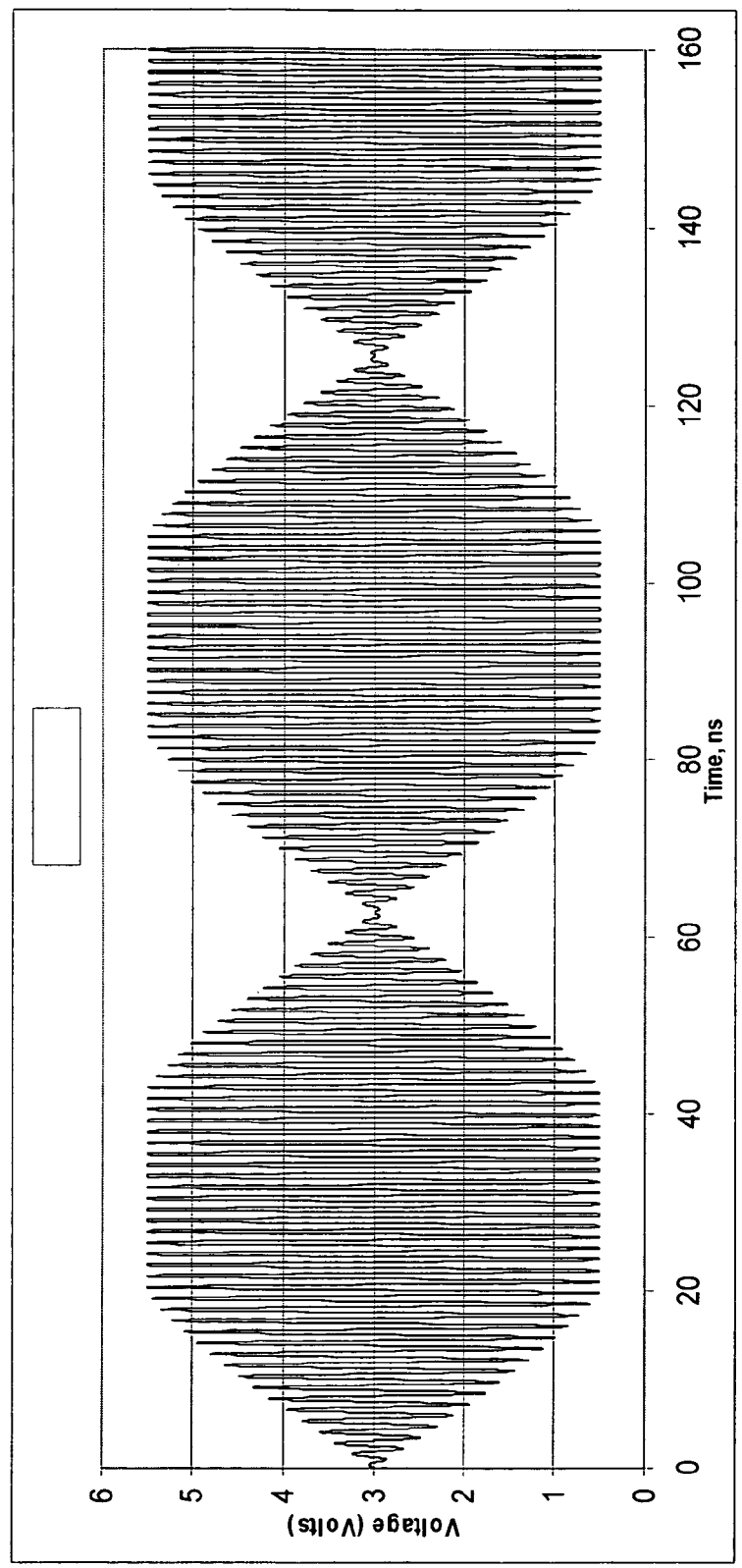
FIG. 4b shows the clipping if the collector boost is not in operation for a real amplifier with the same peaky two-tone waveform.
Figure 4C:
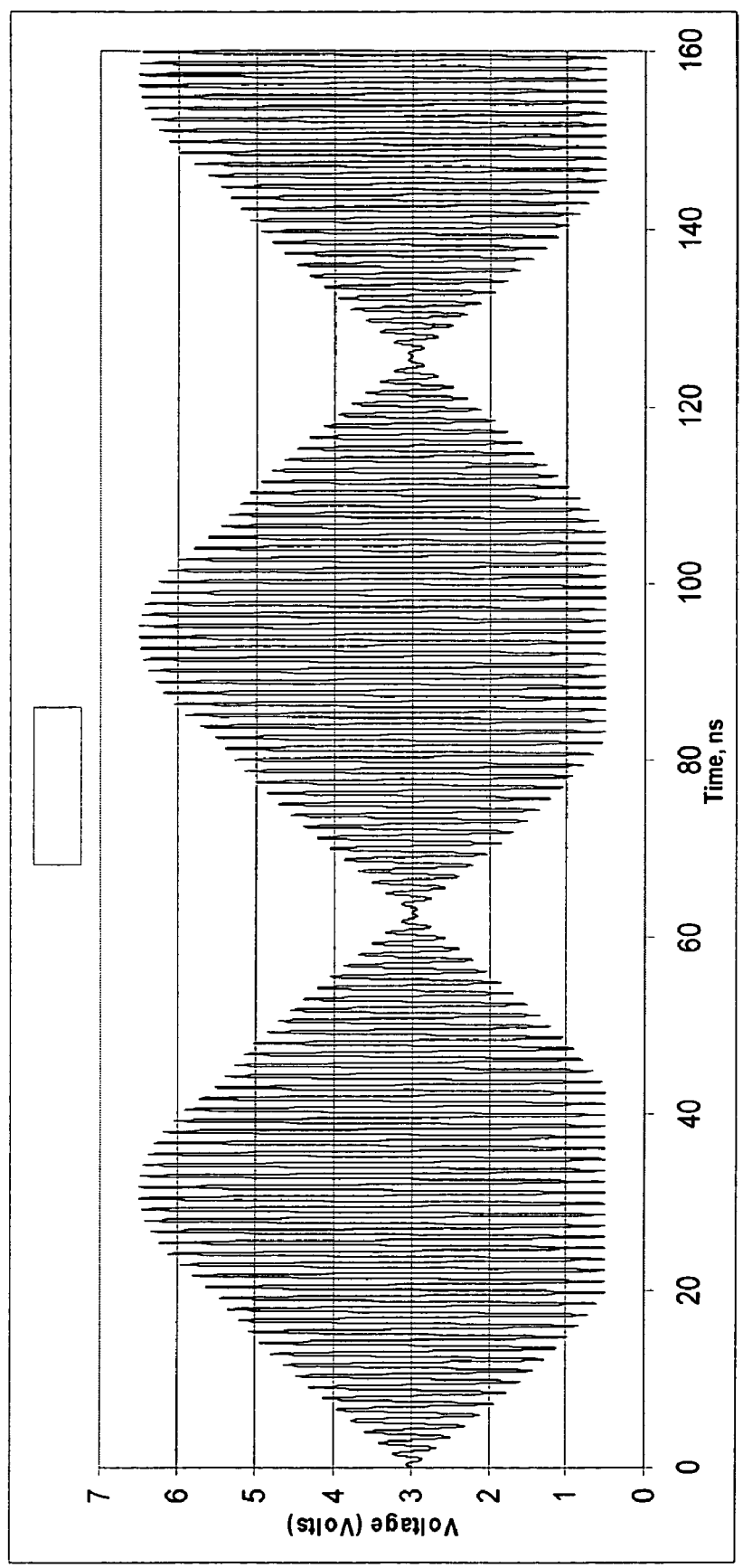
FIG. 4c shows simulation results for a real amplifier with the collector boost of FIG. 2 in operation with the same peaky two-tone waveform.

FIGS. 4c and 4b show the simulation results comparing the collector boost in operation and other than in operation. Specifically, FIG. 4a shows an ideal undistorted two-tone signal with a 3-volt DC bias, as would occur in a perfect amplifier.

FIG. 4b shows the collector voltage at the RF output port 308b of a real amplifier, namely non-perfect, without a charge pump circuit providing for collector boost. As is evident from the graph clipping of the output signal occurs when the peak-to-peak voltage is outside of a predetermined range. In this example the output voltage is limited such that the voltage may not drop below approximately 500 mV as shown in FIG. 4b using a 2.5 GHz sine wave modulated by a 20 MHz carrier as an example applied RF input signal. This is very typical of the saturation characteristic of a typical RF power NPN transistor device.

FIG. 4c shows the effect of the current pump circuit in operation as the collector voltage is boosted in operation once the detectors (320 in FIG. 3 and 250 in FIG. 2) sense that the voltage at the RF output port 308b or 210 is near an amplitude wherein clipping/saturation occurs. In the example shown here, the detector reference voltage has been set to cause the detector to trigger before the output stage saturates to allow for the finite speed of the detector and boost circuit. As such FIG. 4c shows the result of boosting of the power rail voltage Vcc in a relatively linear and on demand fashion. Here, the voltage increases as needed in response to the sensed amplitude at the RF output port 308b or 210. The increase in DC voltage (which is the average of the sine wave) is apparent in the highest amplitude parts of the graph. When the DC content is removed, the resultant is identical to the original signal, FIG. 4a.

Figure 5:
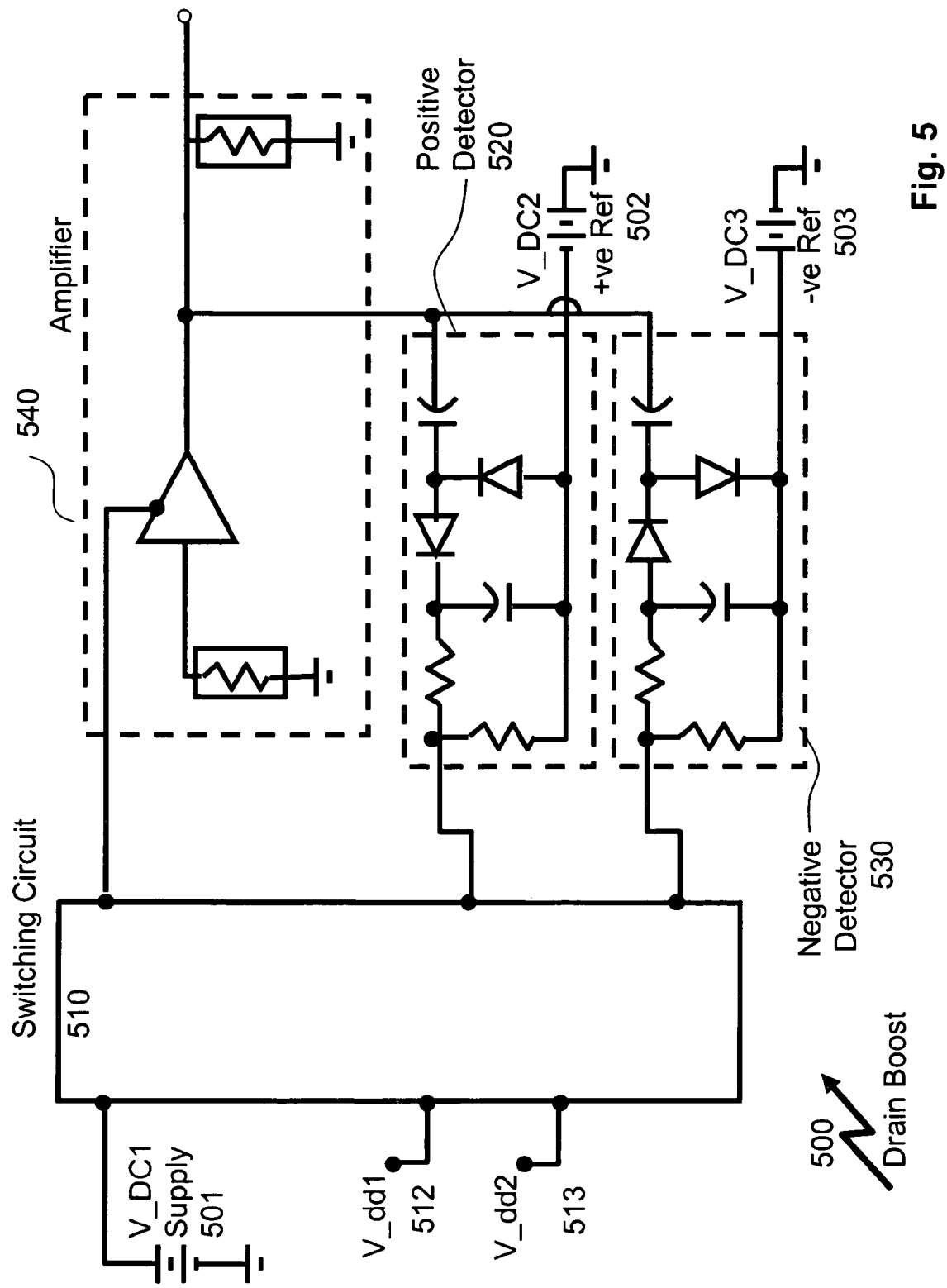
FIG. 5 shows a circuit diagram for implementing a third embodiment of the invention.

Referring to FIG. 5, another embodiment similar to that of FIG. 3 is shown wherein power supplies V_dd1 512 and V_dd2 513 are provided in place of the previous charge pump 340. Such a circuit operates effectively when peak amplitude signals are of long duration. In contrast, the circuit of FIG. 3 operates without clipping when signals of amplitude greater than the threshold amplitude occur infrequently and without duration sufficient for discharging the charge storage capacitor 307. Typically, signals of amplitude greater than the threshold amplitude occur infrequently and without a significant duration. That said; there are applications wherein peak amplitude signals are provided for longer durations where a dual power supply circuit is preferable. Further, there are circuits already including two power rails having different amplitudes sufficient for the circuit of FIG. 5, wherein the circuit of FIG. 5 is a simpler implementation.

In the circuit of FIG. 5, the amplifier 540, positive detector 520 and negative detector 530 are present. A switching circuit 510 switches between the two power supplies. Advantageously, the output RF signal is monitored such that with reasonable testing it is assured that following begins sufficiently early to avoid clipping at the output. Further, where other factors within the circuit effect the output amplitude, these factors are also effectively being monitored the output amplitude is monitored. Advantageously, the circuit is implementable without discontinuity in the amplifier supply voltage such that the voltage supply to the RF amplifier follows the RF envelope of the output RF signal. Further advantageously, the embodiments described herein are highly integratable. Further, it is integratable within a same die as the power amplifier.

The present invention increases the collector voltage on an amplifying transistor of a stage of a power amplifier typically for a brief interval. The increased collector voltage provides higher peak power during a peak pulse in the incoming signal. The collector is biased with a lower collector voltage than would normally be required and this technique is used to respond to peaks in the OFDM signal. The lower collector voltage that is quiescent allows a reduction in power consumption. In order to properly provide an undistorted output signal, the collector voltage is increased at the correct time without delay relative to the RF output signal and for at least the correct duration. The increase in the collector voltage during the period of the peak pulse allows an amplified signal with less distortion than that provided with the lower collector voltage.

Advantageously, the present invention as described supports complete integration allowing for low cost implementation thereof.

Though the above description refers to OFDM, the invention is also applicable to other high peak-to-average formats, for example multiple carrier FDM and CDMA.

Numerous other embodiments may be envisioned without departing from the spirit or scope of the invention.

What is claimed is:

1. A circuit comprising:
   a charge storage component;
   an amplifier voltage supply port for supplying voltage to an RF amplifier;
   a first voltage supply input port for receiving a first voltage;
   at least one detector electrically connected to an output port of the RF amplifier, the at least one detector for detecting an amplitude of an RF output signal provided from the RF amplifier and for providing a first indicator signal while the amplitude is below a first threshold amplitude, and for providing a second indicator signal while the amplitude is above a second threshold amplitude and wherein the second indicator signal varies with a magnitude of the amplitude, wherein the first threshold amplitude is less than the second threshold amplitude; and,
   at least a switch responsive to the first indicator signal for switching into a first mode of operation in which the at least a switch is for charging of the charge storage component and for providing the first voltage to the amplifier voltage supply port and responsive to the second indicator signal for switching into a second mode of operation in which the at least a switch is for providing a boost voltage at the amplifier voltage supply port in excess of the first voltage with use of a magnitude of the second indicator signal, the boost voltage resulting from the summation of a voltage across the charge storage component and the first voltage and following the amplitude of the RF output signal.

2. A circuit according to claim 1, wherein the circuit comprises at least one of BJT, FET, capacitor and resistor.

3. A circuit according to claim 1, wherein the charge storage component comprises a capacitor.

4. A circuit according to claim 3, wherein the circuit comprises the RF amplifier, and wherein the RF amplifier comprises an amplifying transistor, wherein the amplifying transistor has a base, an emitter and a collector, wherein the amplifying transistor is coupled for receiving a supply voltage from the amplifier voltage supply port.

5. A circuit according to claim 3, comprising an wherein the circuit comprises the RF amplifier, wherein the RF amplifier comprises an amplifying transistor, and wherein the amplifying transistor has a gate, source, and drain, wherein the amplifying transistor is coupled for receiving a supply voltage from the amplifier voltage supply port.

6. A circuit according to claim 4, wherein the RF amplifier is biased for at least one of class A, class AB, class B and class F operation.

7. A circuit according to claim 4, comprising an RF signal input port for receiving an RF signal and coupled with the amplifying transistor of the RF amplifier for amplifying of said received RF signal.

8. A circuit according to claim 7 wherein the at least one detector provides the second indicator signal by comparing the output RF signal amplitude provided from the RF amplifier against the second threshold amplitude and setting the magnitude of the second indicator signal relative to the second threshold amplitude, wherein the second threshold amplitude is such that the second indicator signal is provided immediately before clipping will occur.

9. A circuit according to claim 8 wherein the second indicator signal is provided to a transistor in the at least a switch to drive the transistor in an approximately linear range of operation.

10. A circuit according to claim 9, wherein the at least a switch comprises a charge pump circuit comprising two transistors coupled in series one with another, the charge pump circuit for charging of the charge storage component and for generating the boost voltage.

11. A circuit according to claim 1 wherein the boost voltage provided to the RF amplifier supply voltage port is smoothly varying.

12. A circuit according to claim 1 wherein circuit components other than the charge storage component is integrated within a single integrated circuit.

13. A circuit according to claim 12 wherein the circuit components other than the charge storage component is integrated within a same die as the RF amplifier.

14. A circuit according to claim 1, wherein the at least a switch comprises a charge pump circuit comprising a first transistor and a second transistor coupled in series one with another, the charge pump circuit for charging of the charge storage component, wherein the at least one detector comprises:
   a positive detector circuit for providing the second indicator signal to the charge pump circuit; and
   a negative detector circuit for providing the first indicator signal to the charge pump circuit.

15. A circuit according to claim 14 wherein the first transistor is coupled via its gate to an output of the positive detector for receiving the second indicator signal and generating a higher drain voltage in response thereto, for discharging the charge storage component therethrough, and for providing the boost voltage, and wherein the second transistor is coupled via its gate to an output of the negative detector for receiving the first indicator signal, and wherein the second transistor is normally biased for conducting, the second transistor, when conducting forming a current flow path from a first voltage supply to a ground for charging of the charge storage component.

16. A circuit according to claim 15 wherein the charge storage component comprises a capacitor and wherein the current flow path is in series with the capacitor.

17. A circuit comprising:
   an amplifier voltage supply port for supplying voltage to an RF amplifier;
   a first voltage supply input port for receiving a first voltage;
   a second voltage supply input port for receiving a second other voltage;
   at least one detector electrically connected to an output port of the RF amplifier, the at least one detector for detecting an amplitude of an RF output signal provided from the RF amplifier and for providing a first indicator signal while the amplitude is below a first threshold amplitude, and for providing a second indicator signal while the amplitude is above a second threshold amplitude and wherein the second indicator signal varies with a magnitude of the amplitude, wherein the first threshold amplitude is less than the second threshold amplitude; and,
   at least a switch responsive to the first indicator signal for switching into a first mode of operation in which the at least a switch is for providing a voltage based on the first voltage at the amplifier voltage supply port and responsive to the second indicator signal for switching into a second mode of operation in which the at least a switch is for providing another voltage at the amplifier voltage supply port, the another voltage composed of the first voltage and the second other voltage with use of a magnitude of the second indicator signal and varying in dependence upon the amplitude of the RF output signal.

18. A method of improving linearity of a power amplifier comprising:
   amplifying an RF signal to provide an amplified RF signal comprising:
      providing an amplifier circuit including an amplifier voltage supply input port;
      detecting an amplitude of the amplified RF signal at an amplifier output port of the amplifier circuit;
      providing a first indicator signal while the amplitude is below a first threshold amplitude, and providing a second indicator signal while the amplitude is above a second threshold amplitude wherein the second indicator signal varies with a magnitude of the amplitude, wherein the first threshold amplitude is less than the second threshold amplitude;
      in a first mode of operation in response to the first indicator signal, providing a first voltage potential to the amplifier voltage supply input port; and
      in a second other mode of operation in response to the second indicator signal, providing a boosted voltage potential to the amplifier voltage supply input port with use of a magnitude of the second indicator signal, the boosted voltage potential formed by summing a first voltage potential from a voltage supply and at least a portion of another voltage potential provided by a charge storage component, the boosted voltage following the detected amplitude in a continuous fashion.

19. A method according to claim 18, comprising:
   providing the RF signal to the amplifier circuit; and
   driving a transistor with the second indicator signal within a linear operating range to maintain the second other mode of operation.

20. A method according to claim 19, wherein providing the RF signal comprises providing an RF signal characterised by a high peak to average power ratio.

21. A method according to claim 18, wherein the second threshold amplitude is below a voltage at which an overload of the amplifier circuit and clipping of the amplified RF signal will result.

* * * * *